(12) United States Patent
Cho et al.

(10) Patent No.: US 11,307,254 B2
(45) Date of Patent: Apr. 19, 2022

(54) CONTACTOR FAILURE RATE PREDICTION SYSTEM AND METHOD

(71) Applicant: LG CHEM, LTD., Seoul (KR)

(72) Inventors: Hyunki Cho, Daejeon (KR); Chang Hyun Sung, Daejeon (KR); Sang Hoon Lee, Daejeon (KR); Yean Sik Choi, Daejeon (KR)

(73) Assignee: LG ENERGY SOLUTION, LTD., Seoul (KR)

( * ) Notice: Subject to any disclaimer, the term of this patent is extended or adjusted under 35 U.S.C. 154(b) by 284 days.

(21) Appl. No.: 16/610,181

(22) PCT Filed: Sep. 28, 2018

(86) PCT No.: PCT/KR2018/011524
§ 371 (c)(1),
(2) Date: Nov. 1, 2019

(87) PCT Pub. No.: WO2019/066551
PCT Pub. Date: Apr. 4, 2019

(65) Prior Publication Data
US 2020/0057107 A1 Feb. 20, 2020

(30) Foreign Application Priority Data
Sep. 29, 2017 (KR) .................. 10-2017-0127215

(51) Int. Cl.
*G01R 31/327* (2006.01)
*G01R 19/165* (2006.01)
*G05B 23/02* (2006.01)

(52) U.S. Cl.
CPC ....... *G01R 31/3274* (2013.01); *G01R 19/165* (2013.01); *G05B 23/0283* (2013.01)

(58) Field of Classification Search
CPC .............. G01R 31/3274; G01R 19/165; G05B 23/0283
See application file for complete search history.

(56) References Cited

U.S. PATENT DOCUMENTS 8,615,372 B2 12/2013 Tomura et al.
8,958,993 B2 2/2015 Maruyama et al.
(Continued)

FOREIGN PATENT DOCUMENTS

CN 103064020 A 4/2013
CN 104569797 A 4/2015
(Continued)

OTHER PUBLICATIONS

Liu Guo-jin et al., Study on Sample Plan of Reliability Compliance Test of Contaclor Relay, Chin. Soc. for Elec. Eng. vol. 27, No. 21, Jul. 2007, 4 pages with English abstract on p. 1.
(Continued)

*Primary Examiner* — Mischita L Henson
(74) *Attorney, Agent, or Firm* — Birch, Stewart, Kolasch & Birch, LLP

(57) ABSTRACT

A system of predicting a failure rate of a contactor before the generation of a failure by counting a lifespan index of the contactor based on normality of through-currents of a primary side and a secondary side of the contactor, and determining that a failure rate of the contactor increases when a count value for an abnormal through-current exceeds a predetermined threshold value.

10 Claims, 3 Drawing Sheets

(56) References Cited

U.S. PATENT DOCUMENTS

| | | | |
|---|---|---|---|
| 9,217,779 | B2 | 12/2015 | Xu et al. |
| 10,355,322 | B2 | 7/2019 | Takatsuka et al. |
| 2013/0187389 | A1* | 7/2013 | Thangamani ............. F03D 9/25 290/55 |
| 2016/0231381 | A1 | 8/2016 | Salziger et al. |

FOREIGN PATENT DOCUMENTS

| | | |
|---|---|---|
| CN | 105116818 A | 12/2015 |
| CN | 105527582 A | 4/2016 |
| CN | 105974303 A | 9/2016 |
| CN | 106772015 A | 5/2017 |
| JP | 5-11277 U | 2/1993 |
| JP | 2004-192441 A | 7/2004 |
| JP | 2013-230023 A | 11/2013 |
| KR | 10-2003-0083329 A | 10/2003 |
| KR | 100882787 B1 * | 2/2009 |
| KR | 10-2011-0111464 A | 10/2011 |
| KR | 10-2013-0051228 A | 5/2013 |
| KR | 10-2014-0093122 A | 7/2014 |
| KR | 10-2015-0089638 A | 8/2015 |
| KR | 10-2017-0062325 A | 6/2017 |
| KR | 10-2017-0062739 A | 6/2017 |

OTHER PUBLICATIONS

International Search Report for PCT/KR2018/011524 dated Jan. 9, 2019.

* cited by examiner

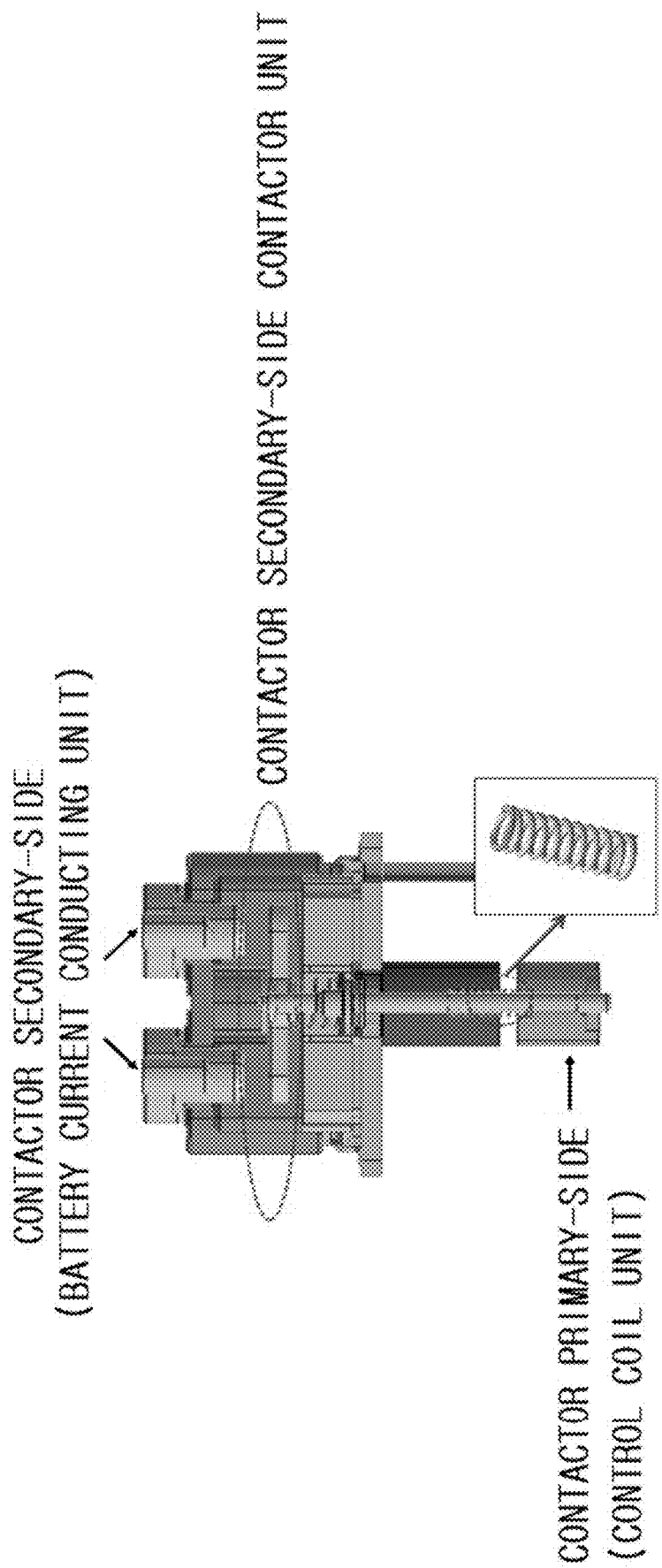
[Figure 1]

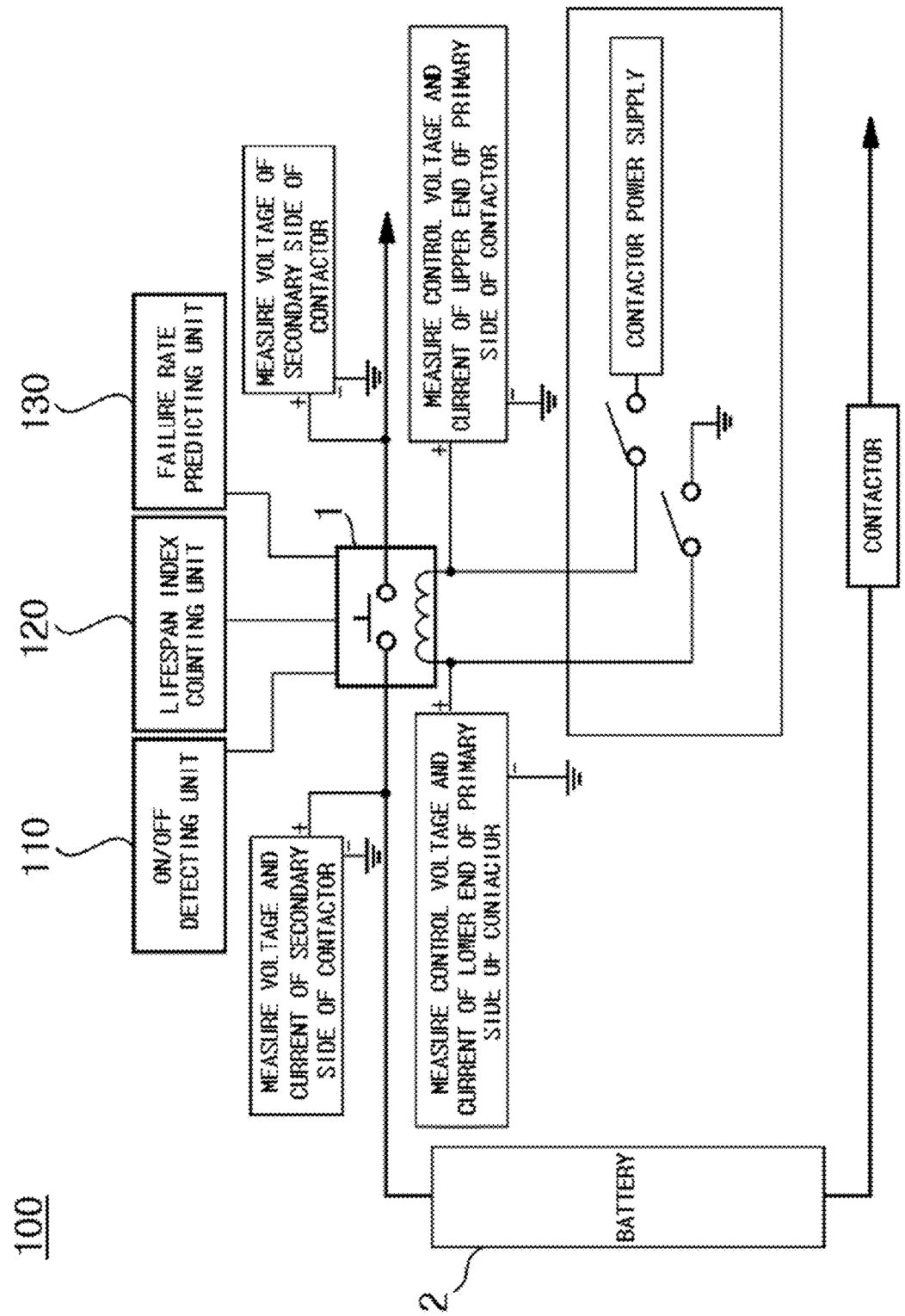
[Figure 2]

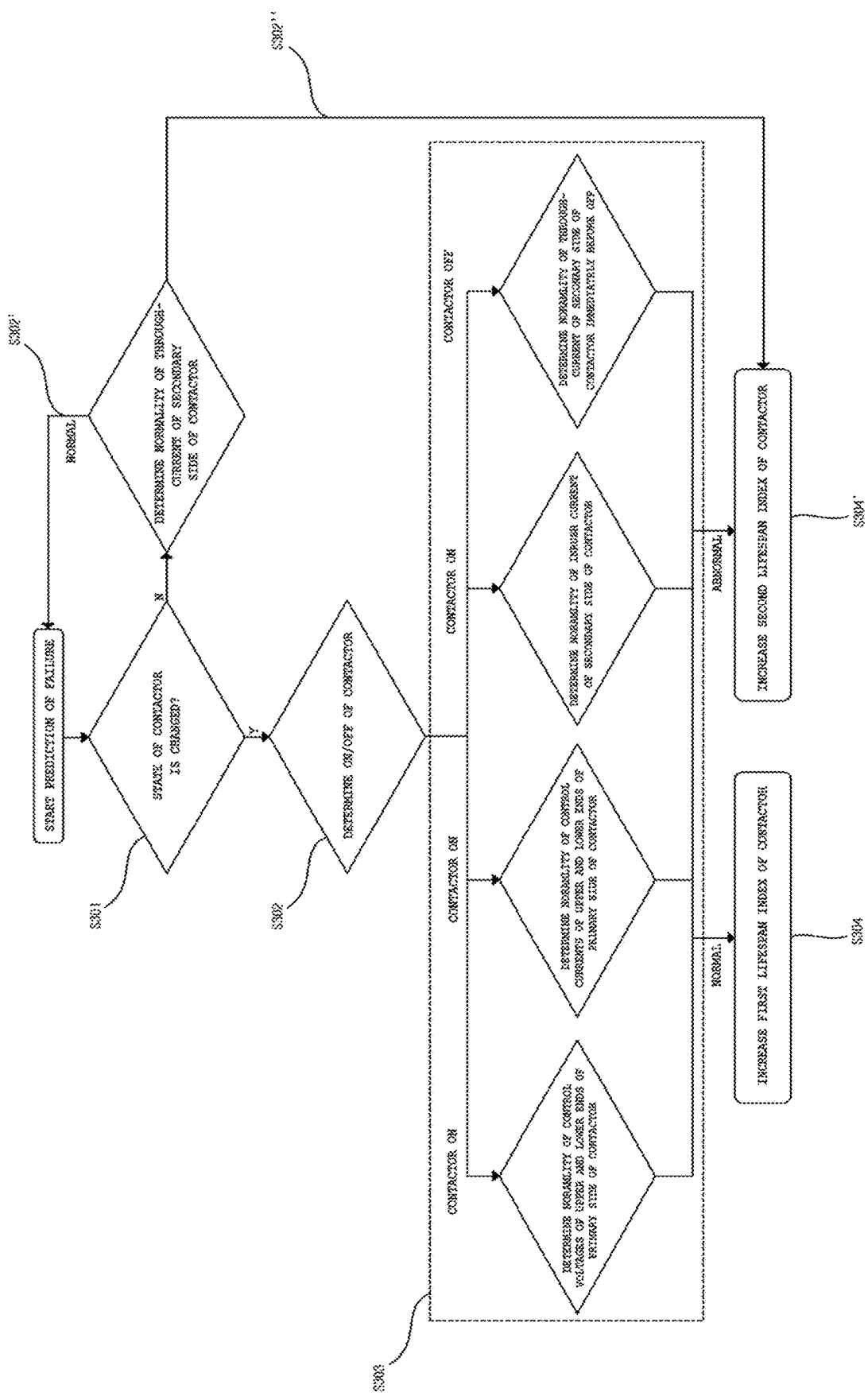
[Figure 3]

CONTACTOR FAILURE RATE PREDICTION SYSTEM AND METHOD

TECHNICAL FIELD

This application claims priority to and the benefit of Korean Patent Application No. 10-2017-0127215 filed in the Korean Intellectual Property Office on Sep. 29, 2017, the entire contents of which are incorporated herein by reference.

The present invention relates to a system and a method of predicting a failure rate of a contactor, and more particularly, to a system and a method of predicting a failure rate of a contactor, which predict and diagnose a failure rate or a lifespan before the generation of a failure of a contactor in advance by counting a lifespan index of the contactor based on normality of through-currents of a primary side and a secondary side of the contactor when the contactor connected with a battery is operated, and determining that a failure rate of the corresponding contactor increases when a count value for an abnormal through-current exceeds a predetermined threshold value, thereby contributing to decreasing repair cost of a system and securing safety of the system.

BACKGROUND ART

In general, when a failure is generated in a main component (for example, a contactor, a fuse, a BMS circuit, and the like) within a battery, there is a concern that a fetal failure, such as a stop of an operation of a system, and the like is generated.

Accordingly, there is a need for a technology for "predicting and diagnosing a failure rate or a lifespan of a component" in advance before a failure of the component, not "diagnosing a failure of a main component after the generation of the failure", and reducing repair cost of a system due to a subsequent failure and improving safety of the system.

For example, the contactor guarantees a lifespan of a product with the number of times of about a hundred thousand of an on/off operation, and when a contactor is turned off during a high current flows or an on-voltage of a primary side (control coil unit) is small and contact resistance of the secondary side (battery current conducting unit) is large, a lifespan of a product may be decreased.

In this respect, the present inventor developed a system and a method of predicting a failure rate of a contactor, which predict and diagnose a failure rate or a lifespan before the generation of a failure of a contactor in advance by counting a lifespan index of the contactor based on normality of through-currents of a primary side and a secondary side of the contactor when the contactor connected with a battery is operated, and determining that a failure rate of the corresponding contactor increases when a count value for an abnormal through-current exceeds a predetermined threshold value, thereby contributing to decreasing repair cost of a system and securing safety of the system.

DETAILED DESCRIPTION OF THE INVENTION

Technical Problem

The present invention is conceived to solve the foregoing problems, and the present invention provides a system and a method of predicting a failure rate of a contactor, which predict and diagnose a failure rate or a lifespan before the generation of a failure of a contactor in advance by counting a lifespan index of the contactor based on normality of through-currents of a primary side and a secondary side of the contactor when the contactor connected with a battery is operated, and determining that a failure rate of the corresponding contactor increases when a count value for an abnormal through-current exceeds a predetermined threshold value, thereby contributing to decreasing repair cost of a system and securing safety of the system.

Technical Solution

An exemplary embodiment of the present invention provides a system for predicting a failure rate of a contactor connected to a battery, the system including: an on/off detecting unit configured to detect an on/off operation of the contactor; a lifespan index counting unit configured to count a lifespan index of the contactor based on whether an electric conducting state of the contactor corresponds to a predetermined electric conducting state during the on operation of the contactor; and a failure rate predicting unit configured to predict a failure rate of the contactor based on the counted lifespan index.

In the exemplary embodiment, the lifespan index counting unit may include: a first measuring unit, which measures control voltage values of primary-side upper and lower ends of the contactor; a second measuring unit, which measures control current values of the primary-side upper and lower ends of the contactor; a third measuring unit, which measures an inrush current value of the secondary side of the contactor; and a fourth measuring unit, which measures a through-current value flowing through the secondary side of the contactor.

In the exemplary embodiment, the first measuring unit determines whether the control voltage values of the primary-side upper and lower ends of the contactor exceed a predetermined threshold value, and the second measuring unit determines whether the control current values of the primary-side upper and lower ends of the contactor exceed a predetermined threshold value, the third measuring unit determines whether the inrush current value of the secondary side of the contactor exceeds a predetermined threshold value, and the fourth measuring unit determines whether the through-current value of the secondary side of the contactor exceeds a predetermined threshold value.

In the exemplary embodiment, when the measurement results of the first to fourth measuring units do not exceed the respective predetermined threshold values, the lifespan index counting unit may determine that the electric conducting state for the contactor corresponds to the predetermined electric conducting state, and increase and count a first lifespan index among the lifespan indexes of the contactor, and when any one or more of the measurement results of the first to fourth measuring units exceed the respective predetermined threshold values, the lifespan index counting unit may determine that the electric conducting state for the contactor does not correspond to the predetermined electric conducting state, and increase and count a second lifespan index among the lifespan indexes of the contactor.

In the exemplary embodiment, when a result value obtained by counting the second lifespan index of the contactor exceeds a predetermined threshold value, the failure rate predicting unit may determine that a failure rate of the contactor increases.

In the exemplary embodiment, the first to third measuring units may respectively determine whether the control voltage values of the primary-side upper and lower ends of the contactor, the control current values of the primary-side upper and lower ends of the contactor, and the inrush current value of the secondary side of the contactor exceed the respective predetermined threshold values in the case where the contactor is on-operated, and the fourth measuring unit may determine whether the through-current value of the secondary side of the contactor exceeds the respective predetermined threshold value in the case where the contactor is off-operated.

Another exemplary embodiment of the present invention provides a method of predicting a failure rate of a contactor connected to a battery, the method including: detecting, by an on/off detecting unit, an on/off operation of the contactor; counting, by a lifespan index counting unit, a lifespan index of the contactor based on whether an electric conducting state for the contactor corresponds to a predetermined electric conducting state during an on-operation of the contactor; and predicting, by a failure rate predicting unit, a failure rate of the contactor based on the counted lifespan.

Advantageous Effects

According to the exemplary embodiments of the present invention, it is possible to predict and diagnose a failure rate or a lifespan before the generation of a failure of a contactor in advance by counting a lifespan index of the contactor based on normality of through-currents of a primary side and a secondary side of the contactor when the contactor connected with a battery is operated, and determining that a failure rate of the corresponding contactor increases when a count value for an abnormal through-current exceeds a predetermined threshold value, thereby contributing to decreasing repair cost of a system and securing safety of the system.

BRIEF DESCRIPTION OF DRAWINGS

FIG. 1 is a diagram schematically illustrating a structure of a contactor 1 connected with a battery.

FIG. 2 is a diagram schematically illustrating a circuit diagram of a circuit, to which a system 100 for predicting a failure rate of a contactor according to an exemplary embodiment of the present invention is applied.

FIG. 3 is a flowchart sequentially illustrating a series of processes of predicting a failure of a contactor 1 through the system 100 for predicting a failure rate of a contactor illustrated in FIG. 2.

MODE FOR CARRYING OUT THE INVENTION

Hereinafter, an exemplary embodiment is presented for helping understanding of the present invention. However, the exemplary embodiment below is simply provided for easier understanding of the present invention, and the contents of the present invention are not limited by the exemplary embodiment.

FIG. 1 is a diagram schematically illustrating a structure of a contactor 1 connected with a battery.

Referring to FIG. 1, the contactor 1 connected with a battery may include a contactor primary side (control coil unit) positioned at a lower side, and a contactor secondary side (battery current conducting unit) positioned at an upper side.

In this case, when a control voltage and a current of the contactor primary side are short, contact resistance of the secondary side is large, a lifespan of the contactor is decreased due to heat and the like when a current flows, thereby increasing a failure rate.

Particularly, when the contactor 1 is turned off in the state where a through-current of the secondary side of the contactor 1 is large, a voltage spark and an arc are generated due to a sudden block of the flowing current, so that a lifespan of the contactor is decreased and thus a failure rate is increased.

Accordingly, the present invention investigates a system and a method of predicting a failure rate of a contactor, which are capable of determining a failure rate of the contactor 1 in advance.

FIG. 2 is a diagram schematically illustrating a circuit diagram of a circuit, to which a system 100 for predicting a failure rate of a contactor according to an exemplary embodiment of the present invention is applied.

Referring to FIG. 2, the system 100 for predicting a failure rate of a contactor according to the exemplary embodiment of the present invention may generally include an on/off detecting unit 110, a lifespan index counting unit 120, and a failure rate predicting unit 130.

The on/off detecting unit 110 may serve to detect an on/off operation of the contactor 1 connected with a battery 2.

More particularly, the on/off detecting unit 110 determines whether a state of the contactor 1 is changed according to an on/off operation of the contactor 1, and when the change in the state of the contactor 1 is not detected, the lifespan index counting unit 120 determines only normality of a through-current of the secondary side of the contactor 1. In this case, when the through-current of the secondary side of the contactor 1 does not exceed a predetermined threshold current value, the on/off detecting unit 110 determines that a failure is generated in the corresponding contactor 1, and when the through-current of the secondary side of the contactor 1 exceeds the predetermined threshold current value, the on/off detecting unit 110 determines that a failure is generated in the corresponding contactor 1, and increases a second lifespan index based on the determination and counts the lifespan index.

The lifespan index counting unit 120 may serve to count a lifespan index of the contactor 1 based on whether an electric conducting state of the contactor 1 corresponds to a predetermined electric conducting state during the on operation of the contactor 1.

More particularly, the lifespan index counting unit 120 may include a first measuring unit, which measures control voltage values of primary-side upper and lower ends of the contactor 1, a second measuring unit, which measures control current values of the primary-side upper and lower ends of the contactor 1, a third measuring unit, which measures an inrush current value of the secondary side of the contactor 1, and a fourth measuring unit, which measures a through-current value flowing through the secondary side of the contactor 1.

Herein, the first and second measuring units determine whether the control voltage values of the primary-side upper and lower ends of the contactor 1 exceed a predetermined threshold value and determines whether the control current values of the primary-side upper and lower ends of the contactor 1 exceed a predetermined threshold value, respectively, and the third and fourth measuring units determine whether the inrush current value of the secondary side of the contactor 1 exceeds a predetermined threshold value and determine whether the through-current value of the secondary side of the contactor 1 exceeds a predetermined threshold value, respectively. Further, herein, both terminals of the primary side of the contactor 1 may be connected to a contactor lower-end control unit and a contactor upper-end control unit, respectively.

Further, in the exemplary embodiment, when the measurement results of the first to fourth measuring units do not exceed the predetermined threshold values, the lifespan index counting unit 120 determines that the electric conducting state for the contactor 1 corresponds to the predetermined electric conducting state (for example, a normal state), and increases and counts a first lifespan index that is a count numerical value for the normal operation among the lifespan indexes of the contactor 1. On the contrast, any one or more of the measurement results exceed the predetermined threshold values, the lifespan index counting unit 120 determines that the electric conducting state for the contactor 1 does not correspond to the predetermined electric conducting state (for example, an abnormal state), and increases and counts a second lifespan index that is a count numerical value for the abnormal operation among the lifespan indexes of the contactor 1.

Further, in the exemplary embodiment, the first to third measuring units determine whether the control voltage values of the primary-side upper and lower ends of the contactor 1, the control current values of the primary-side upper and lower ends of the contactor 1, and the inrush current value of the secondary side of the contactor 1 exceed the predetermined threshold values in the case (at the time) where the contactor 1 is on-operated, and the fourth measuring unit determines whether the through-current value of the secondary side of the contactor 1 exceeds the predetermined threshold value in the case (at the time) where the contactor 1 is off-operated.

The failure rate predicting unit 130 may serve to predict a failure rate of the contactor 1 based on the counted first lifespan index and second lifespan index.

When a result value obtained by counting the second lifespan index of the contactor 1 exceeds a predetermined threshold value, the failure rate predicting unit 130 may determine that a failure rate of the contactor 1 increases.

Further, in the exemplary embodiment, the lifespan index counting unit 120 may count the first and second lifespan indexes for the contactor 1 based on whether an accumulative current value of the current flowing in the contactor 1, a real-time current value, an accumulative electric conducting time, a continuous electric conducting time, a heating temperature, a temperature, humidity, and the like exceed predetermined threshold values, in addition to the voltage value and the current value of the contactor 1.

Next, a process of predicting a failure rate of the contactor 1 through the system 100 for predicting a failure rate of a contactor will be described with reference to FIG. 3.

Referring to FIG. 3, first, the on/off detecting unit 110 determines whether a state of the contactor 1 is changed (S301), and when the state of the contactor 1 is changed, an on/off operation of the contactor 1 is determined (S302). In contrast, when the state of the contactor 1 is not changed, the lifespan index counting unit 120 determines whether a through-current of the secondary side of the contactor 1 exceeds a predetermined threshold value (S302'). In this case, when the through-current of the secondary side of the contactor 1 exceeds the predetermined threshold value, the lifespan index counting unit 120 counts a second lifespan index (S302").

Next, the lifespan index counting unit 120 determines whether control voltage values of the primary-side upper and lower ends of the contactor, control current values of the primary-side upper and lower ends of the contactor, an inrush current value of the secondary side of the contactor, and a through-current value of the secondary side of the contactor exceed predetermined threshold values during an on/off operation of the contactor 1 (S303), and when the values do not exceed the predetermined threshold values, the lifespan index counting unit 120 counts a first lifespan index (S304), and when the values exceed the predetermined threshold values, the lifespan index counting unit 120 counts the second lifespan index (S304').

In the forgoing, the present invention has been described with reference to the exemplary embodiment of the present invention, but those skilled in the art may appreciate that the present invention may be variously corrected and changed within the range without departing from the spirit and the area of the present invention described in the appending claims.

The invention claimed is:

1. A system for predicting a failure rate of a contactor connected to a battery, the system comprising:
   an on/off detecting unit configured to detect an on/off operation of the contactor;
   a lifespan index counting unit configured to count a lifespan index of the contactor based on whether an electric conducting state of the contactor corresponds to a predetermined electric conducting state during the on operation of the contactor; and
   a failure rate predicting unit configured to predict a failure rate of the contactor based on the counted lifespan index,
   wherein the lifespan index counting unit includes:
   a first measuring unit, which measures control voltage values of primary-side upper and lower ends of the contactor;
   a second measuring unit, which measures control current values of the primary-side tipper and lower ends of the contactor;
   a third measuring unit, which measures an inrush current value of a secondary side of the contactor; and
   a fourth measuring unit, which measures a through-current value flowing through the secondary side of the contactor.

2. The system of claim 1, wherein the first measuring unit determines whether the control voltage values of the primary-side upper and lower ends of the contactor exceed a predetermined threshold value,
   wherein the second measuring unit determines whether the control current values of the primary-side upper and lower ends of the contactor exceed a predetermined threshold value, wherein the third measuring unit determines whether the inrush current value of the secondary side of the contactor exceeds a predetermined threshold value, and
   wherein the fourth measuring unit determines whether the through-current value of the secondary side of the contactor exceeds a predetermined threshold value.

3. The system of claim 2, wherein when the measurement results of the first to fourth measuring units do not exceed the respective predetermined threshold values, the lifespan index counting unit determines that the electric conducting state for the contactor corresponds to the predetermined electric conducting state, and increases and counts a first lifespan index among the lifespan indexes of the contactor, and
   when any one or more of the measurement results of the first to fourth measuring units exceed the respective predetermined threshold values, the lifespan index counting unit determines that the electric conducting state for the contactor does not correspond to the predetermined electric conducting state, and increases and counts a second lifespan index among the lifespan indexes of the contactor.

4. The system of claim 3, wherein when a result value obtained by counting the second lifespan index of the contactor exceeds a predetermined threshold value, the failure rate predicting unit determines that a failure rate of the contactor increases.

5. The system of claim 1, wherein the first to third measuring units respectively determine whether the control voltage values of the primary-side upper and lower ends of the contactor, the control current values of the primary-side upper and lower ends of the contactor, and the inrush current value of the secondary side of the contactor exceed the respective predetermined threshold values in the case where the contactor is on-operated, and the fourth measuring unit determines whether the through-current value of the secondary side of the contactor exceeds the respective predetermined threshold value in the case where the contactor is off-operated.

6. A method of predicting a failure rate of a contactor connected to a battery, the method comprising:

detecting, by an on/off detecting unit, an on/off operation of the contactor;

counting, by a lifespan index counting unit, a lifespan index of the contactor based on whether an electric conducting state for the contactor corresponds to a predetermined electric conducting state during an on-operation of the contactor; and predicting, by a failure rate predicting unit, a failure rate of the contactor based on the counted lifespan index, wherein the counting of the lifespan index of the contactor includes:

measuring, by a first measuring unit, control voltage values of primary-side upper and tower ends of the contactor;

measuring, by a second measuring unit, control current values of the primary-side upper and lower ends of the contactor;

measuring, by a third measuring unit, an inrush current value of a secondary side of the contactor; and measuring, by a fourth measuring unit, a through-current value flowing through the secondary side of the contactor.

7. The method of claim 6, wherein the counting of the lifespan index of the contactor further includes:

determining, by the first measuring unit, whether the control voltage values of the primary-side upper and lower ends of the contactor exceed a predetermined threshold value, determining, by the second measuring unit, whether the control current values of the secondary-side upper and lower ends of the contactor exceed a predetermined threshold value, determining, by the third measuring unit, whether the inrush current value of the secondary side of the contactor exceeds a predetermined threshold value, and determining, by the fourth measuring unit, whether the through-current value of the secondary side of the contactor exceeds a predetermined threshold value.

8. The method of claim 7, wherein the counting of the lifespan index of the contactor further includes: when the measurement results of the first to fourth measuring units do not exceed the predetermined threshold values, determining, by the lifespan index counting unit, that the electric conducting state for the contactor corresponds to the predetermined electric conducting state, and increasing and counting a first lifespan index among the lifespan indexes of the contactor, and wherein when any one or more of the measurement results of the first to fourth measuring units exceed the predetermined threshold values, determining, by the lifespan index counting unit, that the electric conducting state for the contactor does not correspond to the predetermined electric conducting state, and increasing and counting a second lifespan index among the lifespan indexes of the contactor.

9. The method of claim 8, wherein the predicting of the failure rate of the contactor includes when a result value obtained by counting the second lifespan index of the contactor exceeds a predetermined threshold value, determining, by the failure rate predicting unit, that a failure rate of the contactor increases.

10. The method of claim 6, wherein the counting of the lifespan index of the contactor includes:

respectively determining, by the first to third measuring units, whether the control voltage values of the primary-side upper and lower ends of the contactor, the control current values of the primary-side upper and lower ends of the contactor, and the inrush current value of the secondary side of the contactor exceed the respective predetermined threshold values in the case where the contactor is on-operated, and determining, by the fourth measuring unit, whether the through-current value of the secondary side of the contactor exceeds the predetermined threshold value in the case where the contactor is off-operated.

* * * * *